United States Patent
Chaji et al.

(10) Patent No.: US 10,867,536 B2
(45) Date of Patent: Dec. 15, 2020

(54) INSPECTION SYSTEM FOR OLED DISPLAY PANELS

(71) Applicant: Ignis Innovation Inc., Waterloo (CA)

(72) Inventors: Gholamreza Chaji, Waterloo (CA); Stefan Alexander, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 1085 days.

(21) Appl. No.: 14/257,113

(22) Filed: Apr. 21, 2014

(65) Prior Publication Data

US 2014/0312330 A1 Oct. 23, 2014

Related U.S. Application Data

(60) Provisional application No. 61/861,614, filed on Aug. 2, 2013, provisional application No. 61/814,580, filed on Apr. 22, 2013.

(51) Int. Cl.
   G09G 3/00       (2006.01)
   G01L 27/00      (2006.01)
   H01L 27/32      (2006.01)
   H01L 51/00      (2006.01)

(52) U.S. Cl.
   CPC .......... *G09G 3/006* (2013.01); *H01L 27/3244* (2013.01); *H01L 51/0031* (2013.01)

(58) Field of Classification Search
   CPC .. G09G 3/006; H01L 51/0031; H01L 27/3244
   See application file for complete search history.

(56) References Cited

U.S. PATENT DOCUMENTS

| | | | |
|---|---|---|---|
| 3,506,851 | A | 4/1970 | Polkinghorn et al. |
| 3,774,055 | A | 11/1973 | Bapat et al. |
| 4,090,096 | A | 5/1978 | Nagami |
| 4,160,934 | A | 7/1979 | Kirsch |
| 4,354,162 | A | 10/1982 | Wright |
| 4,943,956 | A | 7/1990 | Noro |
| 4,996,523 | A | 2/1991 | Bell et al. |

(Continued)

FOREIGN PATENT DOCUMENTS

| | | |
|---|---|---|
| CA | 1 294 034 | 1/1992 |
| CA | 2 109 951 | 11/1992 |

(Continued)

OTHER PUBLICATIONS

First Office Action in Chinese Patent Application No. 201480022682. 4, dated Apr. 20, 2017, in Chinese (7 pages).

(Continued)

*Primary Examiner* — Alexander Satanovsky
(74) *Attorney, Agent, or Firm* — Stratford Managers Corporation

(57) ABSTRACT

A system for inspecting at least a portion of a display panel having thin film transistors (TFTs) and light emitting devices (OLEDs), during or immediately following fabrication, so that adjustments can be made to the fabrication procedures to avoid defects and non-uniformities. The system provides bonding pads connected to signal lines on at least portions of the display panel, and probe pads along selected edges of the display panel. The probe pads are coupled to the bonding pads through a plurality of multiplexers so that the number of probe pads is smaller than the number of bonding pads.

12 Claims, 4 Drawing Sheets

(56) References Cited

U.S. PATENT DOCUMENTS

| | | | |
|---|---|---|---|
| 5,153,420 A | 10/1992 | Hack et al. | |
| 5,198,803 A | 3/1993 | Shie et al. | |
| 5,204,661 A | 4/1993 | Hack et al. | |
| 5,266,515 A | 11/1993 | Robb et al. | |
| 5,404,099 A * | 4/1995 | Sahara | G01R 31/3004 324/750.3 |
| 5,489,918 A | 2/1996 | Mosier | |
| 5,498,880 A | 3/1996 | Lee et al. | |
| 5,557,342 A | 9/1996 | Eto et al. | |
| 5,572,444 A | 11/1996 | Lentz et al. | |
| 5,589,847 A | 12/1996 | Lewis | |
| 5,619,033 A | 4/1997 | Weisfield | |
| 5,648,276 A | 7/1997 | Hara et al. | |
| 5,670,973 A | 9/1997 | Bassetti et al. | |
| 5,691,783 A | 11/1997 | Numao et al. | |
| 5,714,968 A | 2/1998 | Ikeda | |
| 5,723,950 A | 3/1998 | Wei et al. | |
| 5,744,824 A | 4/1998 | Kousai et al. | |
| 5,745,660 A | 4/1998 | Kolpatzik et al. | |
| 5,748,160 A | 5/1998 | Shieh et al. | |
| 5,815,303 A | 9/1998 | Berlin | |
| 5,870,071 A | 2/1999 | Kawahata | |
| 5,874,803 A | 2/1999 | Garbuzov et al. | |
| 5,880,582 A | 3/1999 | Sawada | |
| 5,903,248 A | 5/1999 | Irwin | |
| 5,917,280 A | 6/1999 | Burrows et al. | |
| 5,923,794 A | 7/1999 | McGrath et al. | |
| 5,945,972 A | 8/1999 | Okumura et al. | |
| 5,949,398 A | 9/1999 | Kim | |
| 5,952,789 A | 9/1999 | Stewart et al. | |
| 5,952,991 A | 9/1999 | Akiyama et al. | |
| 5,982,104 A | 11/1999 | Sasaki et al. | |
| 5,990,629 A | 11/1999 | Yamada et al. | |
| 6,023,259 A | 2/2000 | Howard et al. | |
| 6,069,365 A | 5/2000 | Chow et al. | |
| 6,091,203 A | 7/2000 | Kawashima et al. | |
| 6,097,360 A | 8/2000 | Holloman | |
| 6,144,222 A | 11/2000 | Ho | |
| 6,177,915 B1 | 1/2001 | Beeteson et al. | |
| 6,229,506 B1 | 5/2001 | Dawson et al. | |
| 6,229,508 B1 | 5/2001 | Kane | |
| 6,246,180 B1 | 6/2001 | Nishigaki | |
| 6,252,248 B1 | 6/2001 | Sano et al. | |
| 6,259,424 B1 | 7/2001 | Kurogane | |
| 6,262,589 B1 | 7/2001 | Tamukai | |
| 6,271,825 B1 | 8/2001 | Greene et al. | |
| 6,288,696 B1 | 9/2001 | Holloman | |
| 6,304,039 B1 | 10/2001 | Appelberg et al. | |
| 6,307,322 B1 | 10/2001 | Dawson et al. | |
| 6,310,962 B1 | 10/2001 | Chung et al. | |
| 6,320,325 B1 | 11/2001 | Cok et al. | |
| 6,323,631 B1 | 11/2001 | Juang | |
| 6,356,029 B1 | 3/2002 | Hunter | |
| 6,373,454 B1 | 4/2002 | Knapp et al. | |
| 6,392,617 B1 | 5/2002 | Gleason | |
| 6,414,661 B1 | 7/2002 | Shen et al. | |
| 6,417,825 B1 | 7/2002 | Stewart et al. | |
| 6,433,488 B1 | 8/2002 | Bu | |
| 6,437,106 B1 | 8/2002 | Stoner et al. | |
| 6,445,369 B1 | 9/2002 | Yang et al. | |
| 6,475,845 B2 | 11/2002 | Kimura | |
| 6,501,098 B2 | 12/2002 | Yamazaki | |
| 6,501,466 B1 | 12/2002 | Yamagishi et al. | |
| 6,518,962 B2 | 2/2003 | Kimura et al. | |
| 6,522,315 B2 | 2/2003 | Ozawa et al. | |
| 6,525,683 B1 | 2/2003 | Gu | |
| 6,531,827 B2 | 3/2003 | Kawashima | |
| 6,542,138 B1 | 4/2003 | Shannon et al. | |
| 6,555,420 B1 | 4/2003 | Yamazaki | |
| 6,580,408 B1 | 6/2003 | Bae et al. | |
| 6,580,657 B2 | 6/2003 | Sanford et al. | |
| 6,583,398 B2 | 6/2003 | Harkin | |
| 6,583,775 B1 | 6/2003 | Sekiya et al. | |
| 6,594,606 B2 | 7/2003 | Everitt | |
| 6,618,030 B2 | 9/2003 | Kane et al. | |
| 6,639,244 B1 | 10/2003 | Yamazaki et al. | |
| 6,668,645 B1 | 12/2003 | Gilmour et al. | |
| 6,677,713 B1 | 1/2004 | Sung | |
| 6,680,580 B1 | 1/2004 | Sung | |
| 6,687,266 B1 | 2/2004 | Ma et al. | |
| 6,690,000 B1 | 2/2004 | Muramatsu et al. | |
| 6,690,344 B1 | 2/2004 | Takeuchi et al. | |
| 6,693,388 B2 | 2/2004 | Oomura | |
| 6,693,610 B2 | 2/2004 | Shannon et al. | |
| 6,697,057 B2 | 2/2004 | Koyama et al. | |
| 6,720,942 B2 | 4/2004 | Lee et al. | |
| 6,724,151 B2 | 4/2004 | Yoo | |
| 6,734,636 B2 | 5/2004 | Sanford et al. | |
| 6,738,034 B2 | 5/2004 | Kaneko et al. | |
| 6,738,035 B1 | 5/2004 | Fan | |
| 6,753,655 B2 | 6/2004 | Shih et al. | |
| 6,753,834 B2 | 6/2004 | Mikami et al. | |
| 6,756,741 B2 | 6/2004 | Li | |
| 6,756,952 B1 | 6/2004 | Decaux et al. | |
| 6,756,985 B1 | 6/2004 | Furuhashi et al. | |
| 6,771,028 B1 | 8/2004 | Winters | |
| 6,777,712 B2 | 8/2004 | Sanford et al. | |
| 6,777,888 B2 | 8/2004 | Kondo | |
| 6,781,567 B2 | 8/2004 | Kimura | |
| 6,806,497 B2 | 10/2004 | Jo | |
| 6,806,638 B2 | 10/2004 | Lin et al. | |
| 6,806,857 B2 | 10/2004 | Sempel et al. | |
| 6,809,706 B2 | 10/2004 | Shimoda | |
| 6,815,975 B2 | 11/2004 | Nara et al. | |
| 6,828,950 B2 | 12/2004 | Koyama | |
| 6,853,371 B2 | 2/2005 | Miyajima et al. | |
| 6,859,193 B1 | 2/2005 | Yumoto | |
| 6,873,117 B2 | 3/2005 | Ishizuka | |
| 6,876,346 B2 | 4/2005 | Anzai et al. | |
| 6,885,356 B2 | 4/2005 | Hashimoto | |
| 6,900,485 B2 | 5/2005 | Lee | |
| 6,903,734 B2 | 6/2005 | Eu | |
| 6,909,243 B2 | 6/2005 | Inukai | |
| 6,909,419 B2 | 6/2005 | Zavracky et al. | |
| 6,911,960 B1 | 6/2005 | Yokoyama | |
| 6,911,964 B2 | 6/2005 | Lee et al. | |
| 6,914,448 B2 | 7/2005 | Jinno | |
| 6,919,871 B2 | 7/2005 | Kwon | |
| 6,924,602 B2 | 8/2005 | Komiya | |
| 6,937,215 B2 | 8/2005 | Lo | |
| 6,937,220 B2 | 8/2005 | Kitaura et al. | |
| 6,940,214 B1 | 9/2005 | Komiya et al. | |
| 6,940,300 B1 * | 9/2005 | Jenkins | G09G 3/006 324/754.03 |
| 6,943,500 B2 | 9/2005 | LeChevalier | |
| 6,947,022 B2 | 9/2005 | McCartney | |
| 6,954,194 B2 | 10/2005 | Matsumoto et al. | |
| 6,956,547 B2 | 10/2005 | Bae et al. | |
| 6,975,142 B2 | 12/2005 | Azami et al. | |
| 6,975,332 B2 | 12/2005 | Arnold et al. | |
| 6,995,510 B2 | 2/2006 | Murakami et al. | |
| 6,995,519 B2 | 2/2006 | Arnold et al. | |
| 7,023,408 B2 | 4/2006 | Chen et al. | |
| 7,027,015 B2 | 4/2006 | Booth, Jr. et al. | |
| 7,027,078 B2 | 4/2006 | Reihl | |
| 7,034,793 B2 | 4/2006 | Sekiya et al. | |
| 7,038,392 B2 | 5/2006 | Libsch et al. | |
| 7,057,359 B2 | 6/2006 | Hung et al. | |
| 7,061,263 B1 * | 6/2006 | Ong | G01R 31/2884 324/750.3 |
| 7,061,451 B2 | 6/2006 | Kimura | |
| 7,064,733 B2 | 6/2006 | Cok et al. | |
| 7,071,932 B2 | 7/2006 | Libsch et al. | |
| 7,088,051 B1 | 8/2006 | Cok | |
| 7,088,052 B2 | 8/2006 | Kimura | |
| 7,095,028 B2 * | 8/2006 | Mollov | A61B 6/032 250/369 |
| 7,102,378 B2 | 9/2006 | Kuo et al. | |
| 7,106,285 B2 | 9/2006 | Naugler | |
| 7,112,820 B2 | 9/2006 | Change et al. | |
| 7,116,058 B2 | 10/2006 | Lo et al. | |
| 7,119,493 B2 | 10/2006 | Fryer et al. | |
| 7,122,835 B1 | 10/2006 | Ikeda et al. | |
| 7,127,380 B1 | 10/2006 | Iverson et al. | |

(56) References Cited

U.S. PATENT DOCUMENTS

| | | |
|---|---|---|
| 7,129,914 B2 | 10/2006 | Knapp et al. |
| 7,164,417 B2 | 1/2007 | Cok |
| 7,193,589 B2 | 3/2007 | Yoshida et al. |
| 7,224,332 B2 | 5/2007 | Cok |
| 7,227,519 B1 | 6/2007 | Kawase et al. |
| 7,245,277 B2 | 7/2007 | Ishizuka |
| 7,248,236 B2 | 7/2007 | Nathan et al. |
| 7,262,753 B2 | 8/2007 | Tanghe et al. |
| 7,274,363 B2 | 9/2007 | Ishizuka et al. |
| 7,310,092 B2 | 12/2007 | Imamura |
| 7,315,295 B2 | 1/2008 | Kimura |
| 7,321,348 B2 | 1/2008 | Cok et al. |
| 7,339,560 B2 | 3/2008 | Sun |
| 7,355,574 B1 | 4/2008 | Leon et al. |
| 7,358,941 B2 | 4/2008 | Ono et al. |
| 7,368,868 B2 | 5/2008 | Sakamoto |
| 7,411,571 B2 | 8/2008 | Huh |
| 7,414,600 B2 | 8/2008 | Nathan et al. |
| 7,423,617 B2 | 9/2008 | Giraldo et al. |
| 7,474,285 B2 | 1/2009 | Kimura |
| 7,502,000 B2 | 3/2009 | Yuki et al. |
| 7,528,812 B2 | 5/2009 | Tsuge et al. |
| 7,535,449 B2 | 5/2009 | Miyazawa |
| 7,554,512 B2 | 6/2009 | Steer |
| 7,569,849 B2 | 8/2009 | Nathan et al. |
| 7,576,718 B2 | 8/2009 | Miyazawa |
| 7,580,012 B2 | 8/2009 | Kim et al. |
| 7,589,707 B2 | 9/2009 | Chou |
| 7,609,239 B2 | 10/2009 | Chang |
| 7,619,594 B2 | 11/2009 | Hu |
| 7,619,597 B2 | 11/2009 | Nathan et al. |
| 7,633,470 B2 | 12/2009 | Kane |
| 7,656,370 B2 | 2/2010 | Schneider et al. |
| 7,800,558 B2 | 9/2010 | Routley et al. |
| 7,847,764 B2 | 12/2010 | Cok et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,924,249 B2 | 4/2011 | Nathan et al. |
| 7,932,883 B2 | 4/2011 | Klompenhouwer et al. |
| 7,969,390 B2 | 6/2011 | Yoshida |
| 7,978,187 B2 | 7/2011 | Nathan et al. |
| 7,994,712 B2 | 8/2011 | Sung et al. |
| 8,026,876 B2 | 9/2011 | Nathan et al. |
| 8,049,420 B2 | 11/2011 | Tamura et al. |
| 8,077,123 B2 | 12/2011 | Naugler, Jr. |
| 8,115,707 B2 | 2/2012 | Nathan et al. |
| 8,208,084 B2 | 6/2012 | Lin |
| 8,223,177 B2 | 7/2012 | Nathan et al. |
| 8,232,939 B2 | 7/2012 | Nathan et al. |
| 8,259,044 B2 | 9/2012 | Nathan et al. |
| 8,264,431 B2 | 9/2012 | Bulovic et al. |
| 8,279,143 B2 | 10/2012 | Nathan et al. |
| 8,339,386 B2 | 12/2012 | Leon et al. |
| 2001/0002703 A1 | 6/2001 | Koyama |
| 2001/0009283 A1 | 7/2001 | Arao et al. |
| 2001/0024181 A1 | 9/2001 | Kubota |
| 2001/0024186 A1 | 9/2001 | Kane et al. |
| 2001/0026257 A1 | 10/2001 | Kimura |
| 2001/0026725 A1 | 10/2001 | Petteruti et al. |
| 2001/0030323 A1 | 10/2001 | Ikeda |
| 2001/0035863 A1 | 11/2001 | Kimura |
| 2001/0040541 A1 | 11/2001 | Yoneda et al. |
| 2001/0043173 A1 | 11/2001 | Troutman |
| 2001/0045929 A1 | 11/2001 | Prache |
| 2001/0052606 A1 | 12/2001 | Sempel et al. |
| 2001/0052940 A1 | 12/2001 | Hagihara et al. |
| 2002/0000576 A1 | 1/2002 | Inukai |
| 2002/0011796 A1 | 1/2002 | Koyama |
| 2002/0011799 A1 | 1/2002 | Kimura |
| 2002/0012057 A1 | 1/2002 | Kimura |
| 2002/0014851 A1 | 2/2002 | Tai et al. |
| 2002/0018034 A1 | 2/2002 | Ohki et al. |
| 2002/0030190 A1 | 3/2002 | Ohtani et al. |
| 2002/0047565 A1 | 4/2002 | Nara et al. |
| 2002/0052086 A1 | 5/2002 | Maeda |
| 2002/0067134 A1 | 6/2002 | Kawashima |
| 2002/0084463 A1 | 7/2002 | Sanford et al. |
| 2002/0101172 A1 | 8/2002 | Bu |
| 2002/0105279 A1 | 8/2002 | Kimura |
| 2002/0117722 A1 | 8/2002 | Osada et al. |
| 2002/0122308 A1 | 9/2002 | Ikeda |
| 2002/0158587 A1 | 10/2002 | Komiya |
| 2002/0158666 A1 | 10/2002 | Azami et al. |
| 2002/0158823 A1 | 10/2002 | Zavracky et al. |
| 2002/0167474 A1 | 11/2002 | Everitt |
| 2002/0180369 A1 | 12/2002 | Koyama |
| 2002/0180721 A1 | 12/2002 | Kimura et al. |
| 2002/0181276 A1 | 12/2002 | Yamazaki |
| 2002/0186214 A1 | 12/2002 | Siwinski |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0043088 A1 | 3/2003 | Booth et al. |
| 2003/0057895 A1 | 3/2003 | Kimura |
| 2003/0058226 A1 | 3/2003 | Bertram et al. |
| 2003/0062524 A1 | 4/2003 | Kimura |
| 2003/0063081 A1 | 4/2003 | Kimura et al. |
| 2003/0071821 A1 | 4/2003 | Sundahl et al. |
| 2003/0076048 A1 | 4/2003 | Rutherford |
| 2003/0090447 A1 | 5/2003 | Kimura |
| 2003/0090481 A1 | 5/2003 | Kimura |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0122813 A1 | 7/2003 | Ishizuki et al. |
| 2003/0142088 A1 | 7/2003 | LeChevalier |
| 2003/0151569 A1 | 8/2003 | Lee et al. |
| 2003/0156101 A1 | 8/2003 | Le Chevalier |
| 2003/0174152 A1 | 9/2003 | Noguchi |
| 2003/0179626 A1 | 9/2003 | Sanford et al. |
| 2003/0185438 A1 | 10/2003 | Osawa et al. |
| 2003/0197663 A1 | 10/2003 | Lee et al. |
| 2003/0210256 A1 | 11/2003 | Mori et al. |
| 2003/0230141 A1 | 12/2003 | Gilmour et al. |
| 2003/0230980 A1 | 12/2003 | Forrest et al. |
| 2003/0231148 A1 | 12/2003 | Lin et al. |
| 2004/0032382 A1 | 2/2004 | Cok et al. |
| 2004/0066357 A1 | 4/2004 | Kawasaki |
| 2004/0070557 A1 | 4/2004 | Asano et al. |
| 2004/0070565 A1 | 4/2004 | Nayar et al. |
| 2004/0090186 A1 | 5/2004 | Kanauchi et al. |
| 2004/0090400 A1 | 5/2004 | Yoo |
| 2004/0095297 A1 | 5/2004 | Libsch et al. |
| 2004/0100427 A1 | 5/2004 | Miyazawa |
| 2004/0108518 A1 | 6/2004 | Jo |
| 2004/0135749 A1 | 7/2004 | Kondakov et al. |
| 2004/0140982 A1 | 7/2004 | Pate |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174354 A1 | 9/2004 | Ono et al. |
| 2004/0178743 A1 | 9/2004 | Miller et al. |
| 2004/0183759 A1 | 9/2004 | Stevenson et al. |
| 2004/0196275 A1 | 10/2004 | Hattori |
| 2004/0207615 A1 | 10/2004 | Yumoto |
| 2004/0227697 A1 | 11/2004 | Mori |
| 2004/0239596 A1 | 12/2004 | Ono et al. |
| 2004/0252089 A1 | 12/2004 | Ono et al. |
| 2004/0257313 A1 | 12/2004 | Kawashima et al. |
| 2004/0257353 A1 | 12/2004 | Imamura et al. |
| 2004/0257355 A1 | 12/2004 | Naugler |
| 2004/0263437 A1 | 12/2004 | Hattori |
| 2004/0263444 A1 | 12/2004 | Kimura |
| 2004/0263445 A1 | 12/2004 | Inukai et al. |
| 2004/0263541 A1 | 12/2004 | Takeuchi et al. |
| 2005/0007355 A1 | 1/2005 | Miura |
| 2005/0007357 A1 | 1/2005 | Yamashita et al. |

(56) References Cited

U.S. PATENT DOCUMENTS

| | | |
|---|---|---|
| 2005/0007392 A1 | 1/2005 | Kasai et al. |
| 2005/0017650 A1 | 1/2005 | Fryer et al. |
| 2005/0024081 A1 | 2/2005 | Kuo et al. |
| 2005/0024393 A1 | 2/2005 | Kondo et al. |
| 2005/0030267 A1 | 2/2005 | Tanghe et al. |
| 2005/0057484 A1 | 3/2005 | Diefenbaugh et al. |
| 2005/0057580 A1 | 3/2005 | Yamano et al. |
| 2005/0067943 A1* | 3/2005 | Sakaguchi ............ G09G 3/006 313/500 |
| 2005/0067970 A1 | 3/2005 | Libsch et al. |
| 2005/0067971 A1 | 3/2005 | Kane |
| 2005/0068270 A1 | 3/2005 | Awakura |
| 2005/0068275 A1 | 3/2005 | Kane |
| 2005/0073264 A1 | 4/2005 | Matsumoto |
| 2005/0083323 A1 | 4/2005 | Suzuki et al. |
| 2005/0088103 A1 | 4/2005 | Kageyama et al. |
| 2005/0110420 A1 | 5/2005 | Arnold et al. |
| 2005/0110807 A1 | 5/2005 | Chang |
| 2005/0140598 A1 | 6/2005 | Kim et al. |
| 2005/0140610 A1 | 6/2005 | Smith et al. |
| 2005/0014891 A1 | 7/2005 | Abe |
| 2005/0156831 A1 | 7/2005 | Yamazaki et al. |
| 2005/0168416 A1 | 8/2005 | Hashimoto et al. |
| 2005/0174045 A1* | 8/2005 | Lee ........................ B05D 1/60 313/504 |
| 2005/0179626 A1 | 8/2005 | Yuki et al. |
| 2005/0179628 A1 | 8/2005 | Kimura |
| 2005/0185200 A1 | 8/2005 | Tobol |
| 2005/0200575 A1 | 9/2005 | Kim et al. |
| 2005/0206590 A1 | 9/2005 | Sasaki et al. |
| 2005/0212787 A1 | 9/2005 | Noguchi et al. |
| 2005/0219184 A1 | 10/2005 | Zehner et al. |
| 2005/0248515 A1 | 11/2005 | Naugler et al. |
| 2005/0269959 A1 | 12/2005 | Uchino et al. |
| 2005/0269960 A1 | 12/2005 | Ono et al. |
| 2005/0280615 A1 | 12/2005 | Cok et al. |
| 2005/0280766 A1 | 12/2005 | Johnson et al. |
| 2005/0285822 A1 | 12/2005 | Reddy et al. |
| 2005/0285825 A1 | 12/2005 | Eom et al. |
| 2006/0001613 A1 | 1/2006 | Routley et al. |
| 2006/0007072 A1 | 1/2006 | Choi et al. |
| 2006/0007249 A1 | 1/2006 | Reddy et al. |
| 2006/0012310 A1 | 1/2006 | Chen et al. |
| 2006/0012311 A1 | 1/2006 | Ogawa |
| 2006/0022305 A1 | 2/2006 | Yamashita |
| 2006/0027807 A1 | 2/2006 | Nathan et al. |
| 2006/0030084 A1 | 2/2006 | Young |
| 2006/0038758 A1 | 2/2006 | Routley et al. |
| 2006/0038762 A1 | 2/2006 | Chou |
| 2006/0066533 A1 | 3/2006 | Sato et al. |
| 2006/0077135 A1 | 4/2006 | Cok et al. |
| 2006/0077142 A1 | 4/2006 | Kwon |
| 2006/0082523 A1 | 4/2006 | Guo et al. |
| 2006/0092185 A1 | 5/2006 | Jo et al. |
| 2006/0097628 A1 | 5/2006 | Suh et al. |
| 2006/0097631 A1 | 5/2006 | Lee |
| 2006/0103611 A1 | 5/2006 | Choi |
| 2006/0149493 A1 | 7/2006 | Sambandan et al. |
| 2006/0170623 A1 | 8/2006 | Naugler, Jr. et al. |
| 2006/0176250 A1 | 8/2006 | Nathan et al. |
| 2006/0208961 A1 | 9/2006 | Nathan et al. |
| 2006/0208971 A1 | 9/2006 | Deane |
| 2006/0214888 A1 | 9/2006 | Schneider et al. |
| 2006/0232522 A1 | 10/2006 | Roy et al. |
| 2006/0244697 A1 | 11/2006 | Lee et al. |
| 2006/0261841 A1 | 11/2006 | Fish |
| 2006/0273997 A1 | 12/2006 | Nathan et al. |
| 2006/0284801 A1 | 12/2006 | Yoon et al. |
| 2006/0284895 A1 | 12/2006 | Marcu et al. |
| 2006/0290618 A1 | 12/2006 | Goto |
| 2007/0001937 A1 | 1/2007 | Park et al. |
| 2007/0001939 A1 | 1/2007 | Hashimoto et al. |
| 2007/0008251 A1 | 1/2007 | Kohno et al. |
| 2007/0008268 A1 | 1/2007 | Park et al. |
| 2007/0008297 A1 | 1/2007 | Bassetti |
| 2007/0057873 A1 | 3/2007 | Uchino et al. |
| 2007/0057874 A1 | 3/2007 | Le Roy et al. |
| 2007/0069998 A1 | 3/2007 | Naugler et al. |
| 2007/0075727 A1 | 4/2007 | Nakano et al. |
| 2007/0076226 A1 | 4/2007 | Klompenhouwer et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0097038 A1 | 5/2007 | Yamazaki et al. |
| 2007/0097041 A1 | 5/2007 | Park et al. |
| 2007/0103419 A1 | 5/2007 | Uchino et al. |
| 2007/0115221 A1 | 5/2007 | Buchhauser et al. |
| 2007/0152672 A1 | 7/2007 | Lee |
| 2007/0182671 A1 | 8/2007 | Nathan et al. |
| 2007/0236440 A1 | 10/2007 | Wacyk et al. |
| 2007/0236517 A1 | 10/2007 | Kimpe |
| 2007/0241999 A1 | 10/2007 | Lin |
| 2007/0273294 A1 | 11/2007 | Nagayama |
| 2007/0285359 A1 | 12/2007 | Ono |
| 2007/0290958 A1 | 12/2007 | Cok |
| 2007/0296672 A1 | 12/2007 | Kim et al. |
| 2008/0001525 A1 | 1/2008 | Chao et al. |
| 2008/0001544 A1 | 1/2008 | Murakami et al. |
| 2008/0036708 A1 | 2/2008 | Shirasaki |
| 2008/0042942 A1 | 2/2008 | Takahashi |
| 2008/0042948 A1 | 2/2008 | Yamashita et al. |
| 2008/0048951 A1 | 2/2008 | Naugler, Jr. et al. |
| 2008/0055209 A1 | 3/2008 | Cok |
| 2008/0074413 A1 | 3/2008 | Ogura |
| 2008/0088549 A1 | 4/2008 | Nathan et al. |
| 2008/0088648 A1 | 4/2008 | Nathan et al. |
| 2008/0111766 A1 | 5/2008 | Uchino et al. |
| 2008/0116787 A1 | 5/2008 | Hsu et al. |
| 2008/0117144 A1 | 5/2008 | Nakano et al. |
| 2008/0150847 A1 | 6/2008 | Kim et al. |
| 2008/0158115 A1 | 7/2008 | Cordes et al. |
| 2008/0158648 A1* | 7/2008 | Cummings ............ G09G 3/006 359/291 |
| 2008/0198103 A1 | 8/2008 | Toyomura et al. |
| 2008/0211749 A1 | 9/2008 | Weitbruch et al. |
| 2008/0231558 A1 | 9/2008 | Naugler |
| 2008/0231562 A1 | 9/2008 | Kwon |
| 2008/0231625 A1 | 9/2008 | Minami et al. |
| 2008/0252571 A1 | 11/2008 | Hente et al. |
| 2008/0290805 A1 | 11/2008 | Yamada et al. |
| 2008/0297055 A1 | 12/2008 | Miyake et al. |
| 2009/0058772 A1 | 3/2009 | Lee |
| 2009/0115737 A1* | 5/2009 | Toyoshima ............ G06F 3/044 345/173 |
| 2009/0121994 A1 | 5/2009 | Miyata |
| 2009/0146926 A1 | 6/2009 | Sung et al. |
| 2009/0160743 A1 | 6/2009 | Tomida et al. |
| 2009/0174628 A1 | 7/2009 | Wang et al. |
| 2009/0184901 A1 | 7/2009 | Kwon |
| 2009/0195483 A1 | 8/2009 | Naugler, Jr. et al. |
| 2009/0201281 A1 | 8/2009 | Routley et al. |
| 2009/0206764 A1 | 8/2009 | Schemmann et al. |
| 2009/0213046 A1 | 8/2009 | Nam |
| 2009/0244046 A1 | 10/2009 | Seto |
| 2010/0004891 A1 | 1/2010 | Ahlers et al. |
| 2010/0039422 A1 | 2/2010 | Seto |
| 2010/0039458 A1 | 2/2010 | Nathan et al. |
| 2010/0060911 A1 | 3/2010 | Marcu et al. |
| 2010/0079419 A1 | 4/2010 | Shibusawa |
| 2010/0165002 A1 | 7/2010 | Ahn |
| 2010/0194670 A1 | 8/2010 | Cok |
| 2010/0207960 A1 | 8/2010 | Kimpe et al. |
| 2010/0225630 A1 | 9/2010 | Levey et al. |
| 2010/0251295 A1 | 9/2010 | Amento et al. |
| 2010/0277400 A1 | 11/2010 | Jeong |
| 2010/0315319 A1 | 12/2010 | Cok et al. |
| 2011/0063197 A1 | 3/2011 | Chung et al. |
| 2011/0069051 A1 | 3/2011 | Nakamura et al. |
| 2011/0069089 A1 | 3/2011 | Kopf et al. |
| 2011/0074750 A1 | 3/2011 | Leon et al. |
| 2011/0130981 A1* | 6/2011 | Chaji ..................... G09G 3/006 702/58 |
| 2011/0149166 A1 | 6/2011 | Botzas et al. |
| 2011/0199395 A1 | 8/2011 | Nathan et al. |

(56) References Cited

U.S. PATENT DOCUMENTS

| | | | |
|---|---|---|---|
| 2011/0227964 A1 | 9/2011 | Chaji et al. | |
| 2011/0273399 A1 | 11/2011 | Lee | |
| 2011/0293480 A1 | 12/2011 | Mueller | |
| 2012/0056558 A1 | 3/2012 | Toshiya et al. | |
| 2012/0062565 A1 | 3/2012 | Fuchs et al. | |
| 2012/0162088 A1* | 6/2012 | van Lieshout | G06F 3/0412 |
| | | | 345/173 |
| 2012/0262184 A1 | 10/2012 | Shen | |
| 2012/0299978 A1 | 11/2012 | Chaji | |
| 2013/0002527 A1 | 1/2013 | Kim | |
| 2013/0027381 A1 | 1/2013 | Nathan et al. | |
| 2013/0057595 A1 | 3/2013 | Nathan et al. | |
| 2013/0112960 A1 | 5/2013 | Chaji et al. | |
| 2013/0135272 A1 | 5/2013 | Park | |
| 2013/0309821 A1 | 11/2013 | Yoo | |
| 2013/0321671 A1 | 12/2013 | Cote et al. | |
| 2014/0027709 A1* | 1/2014 | Higginson | H01L 23/3171 |
| | | | 257/13 |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 432 530 | 7/2002 |
| CA | 2 436 451 | 8/2002 |
| CA | 2 438 577 | 8/2002 |
| CA | 2 463 653 | 1/2004 |
| CA | 2 498 136 | 3/2004 |
| CA | 2 522 396 | 11/2004 |
| CA | 2 443 206 | 3/2005 |
| CA | 2 472 671 | 12/2005 |
| CA | 2 567 076 | 1/2006 |
| CA | 2 526 782 | 4/2006 |
| CA | 2 541 531 | 7/2006 |
| CA | 2 550 102 | 4/2008 |
| CA | 2 773 699 | 10/2013 |
| CN | 1381032 | 11/2002 |
| CN | 1448908 | 10/2003 |
| CN | 1760945 | 4/2006 |
| CN | 1886774 | 12/2006 |
| CN | 101615376 A | 12/2009 |
| CN | 102656621 | 9/2012 |
| CN | 102725786 | 10/2012 |
| CN | 103177685 A | 6/2013 |
| CN | 103280847 A | 9/2013 |
| CN | 103578415 A | 2/2014 |
| EP | 0 158 366 | 10/1985 |
| EP | 1 028 471 | 8/2000 |
| EP | 1 111 577 | 6/2001 |
| EP | 1 130 565 A1 | 9/2001 |
| EP | 1 194 013 | 4/2002 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 145 0341 A | 8/2004 |
| EP | 1 465 143 A | 10/2004 |
| EP | 1 469 448 A | 10/2004 |
| EP | 1 521 203 A2 | 4/2005 |
| EP | 1 594 347 | 11/2005 |
| EP | 1 784 055 A2 | 5/2007 |
| EP | 1854338 A1 | 11/2007 |
| EP | 1 879 169 A1 | 1/2008 |
| EP | 1 879 172 | 1/2008 |
| GB | 2 389 951 | 12/2003 |
| JP | 1272298 | 10/1989 |
| JP | 4-042619 | 2/1992 |
| JP | 6-314977 | 11/1994 |
| JP | 8-340243 | 12/1996 |
| JP | 09-090405 | 4/1997 |
| JP | 10-254410 | 9/1998 |
| JP | 11-202295 | 7/1999 |
| JP | 11-219146 | 8/1999 |
| JP | 11 231805 | 8/1999 |
| JP | 11-282419 | 10/1999 |
| JP | 2000-056847 | 2/2000 |
| JP | 2000-81607 | 3/2000 |
| JP | 2001-134217 | 5/2001 |
| JP | 2001-195014 | 7/2001 |
| JP | 2002-055654 | 2/2002 |
| JP | 2002-91376 | 3/2002 |
| JP | 2002-514320 | 5/2002 |
| JP | 2002-278513 | 9/2002 |
| JP | 2002-333862 | 11/2002 |
| JP | 2003-076331 | 3/2003 |
| JP | 2003-124519 | 4/2003 |
| JP | 2003-177709 | 6/2003 |
| JP | 2003-271095 | 9/2003 |
| JP | 2003-308046 | 10/2003 |
| JP | 2003-317944 | 11/2003 |
| JP | 2004-004675 | 1/2004 |
| JP | 2004-145197 | 5/2004 |
| JP | 2004-287345 | 10/2004 |
| JP | 2005-057217 | 3/2005 |
| JP | 4-158570 | 10/2008 |
| KR | 2004-0100887 | 12/2004 |
| TW | 342486 | 10/1998 |
| TW | 473622 | 1/2002 |
| TW | 485337 | 5/2002 |
| TW | 502233 | 9/2002 |
| TW | 538650 | 6/2003 |
| TW | 1221268 | 9/2004 |
| TW | 1223092 | 11/2004 |
| TW | 200727247 | 7/2007 |
| WO | WO 1998/48403 | 10/1998 |
| WO | WO 1999/48079 | 9/1999 |
| WO | WO 2001/06484 | 1/2001 |
| WO | WO 2001/27910 A1 | 4/2001 |
| WO | WO 2001/63587 A2 | 8/2001 |
| WO | WO 2002/067327 A | 8/2002 |
| WO | WO 2003/001496 A1 | 1/2003 |
| WO | WO 2003/034389 A | 4/2003 |
| WO | WO 2003/058594 A1 | 7/2003 |
| WO | WO 2003/063124 | 7/2003 |
| WO | WO 2003/077231 | 9/2003 |
| WO | WO 2004/003877 | 1/2004 |
| WO | WO 2004/025615 A | 3/2004 |
| WO | WO 2004/034364 | 4/2004 |
| WO | WO 2004/047058 | 6/2004 |
| WO | WO 2004/104975 A1 | 12/2004 |
| WO | WO 2005/022498 | 3/2005 |
| WO | WO 2005/022500 A | 3/2005 |
| WO | WO 2005/029455 | 3/2005 |
| WO | WO 2005/029456 | 3/2005 |
| WO | WO 2005/055185 | 6/2005 |
| WO | WO 2006/000101 A1 | 1/2006 |
| WO | WO 2006/053424 | 5/2006 |
| WO | WO 2006/063448 A | 6/2006 |
| WO | WO 2006/084360 | 8/2006 |
| WO | WO 2007/003877 A | 1/2007 |
| WO | WO 2007/079572 | 7/2007 |
| WO | WO 2007/120849 A2 | 10/2007 |
| WO | WO 2009/048618 A1 | 4/2009 |
| WO | WO 2009/055920 | 5/2009 |
| WO | WO 2010/023270 | 3/2010 |
| WO | WO 2011/041224 A1 | 4/2011 |
| WO | WO 2011/064761 A1 | 6/2011 |
| WO | WO 2011/067729 | 6/2011 |
| WO | WO 2012/160424 A1 | 11/2012 |
| WO | WO 2012/164474 A2 | 12/2012 |
| WO | WO 2012/164475 A2 | 12/2012 |

OTHER PUBLICATIONS

International Search Report in corresponding Application No. PCT/IB2014/060879, dated Jul. 17, 2014 (4 pages).

Written Opinion of the ISA in corresponding Application No. PCT/IB2014/060879, dated Jul. 17, 2014 (3 pages).

(56) References Cited

OTHER PUBLICATIONS

Ahnood et al.: "Effect of threshold voltage instability on field effect mobility in thin film transistors deduced from constant current measurements"; dated Aug. 2009.
Alexander et al.: "Pixel circuits and drive schemes for glass and elastic AMOLED displays"; dated Jul. 2005 (9 pages).
Alexander et al.: "Unique Electrical Measurement Technology for Compensation, Inspection, and Process Diagnostics of AMOLED HDTV"; dated May 2010 (4 pages).
Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon AMOLED Displays"; dated Jul. 2008 (5 pages).
Chaji et al.: "A fast settling current driver based on the CCII for AMOLED displays"; dated Dec. 2009 (6 pages).
Chaji et al.: "A Low-Cost Stable Amorphous Silicon AMOLED Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A Novel Driving Scheme for High Resolution Large-area a-Si:H AMOLED displays"; dated Aug. 2005 (3 pages).
Chaji et al.: "A Stable Voltage-Programmed Pixel Circuit for a-Si:H AMOLED Displays"; dated Dec. 2006 (12 pages).
Chaji et al.: "A Sub-A fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated My 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High-Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
European Search Report for Application No. EP 01 11 22313 dated Sep. 14, 2005 (4 pages).
European Search Report for Application No. EP 04 78 6661 dated Mar. 9, 2009.
European Search Report for Application No. EP 05 75 9141 dated Oct. 30, 2009 (2 pages).
European Search Report for Application No. EP 05 81 9617 dated Jan. 30, 2009.
European Search Report for Application No. EP 06 70 5133 dated Jul. 18, 2008.
European Search Report for Application No. EP 06 72 1798 dated Nov. 12, 2009 (2 pages).
European Search Report for Application No. EP 07 71 0608.6 dated Mar. 19, 2010 (7 pages).
European Search Report for Application No. EP 07 71 9579 dated May 20, 2009.
European Search Report for Application No. EP 07 81 5784 dated Jul. 20, 2010 (2 pages).
European Search Report for Application No. EP 10 16 6143, dated Sep. 3, 2010 (2 pages).
European Search Report for Application No. EP 10 83 4294.0-1903, dated Apr. 8, 2013, (9 pages).
European Search Report for Application No. PCT/CA2006/000177 dated Jun. 2, 2006.
European Supplementary Search Report for Application No. EP 04 78 6662 dated Jan. 19, 2007 (2 pages).
Extended European Search Report for Application No. 11 73 9485.8 dated Aug. 6, 2013(14 pages).
Extended European Search Report for Application No. EP 09 73 3076.5, dated Apr. 27, (13 pages).
Extended European Search Report for Application No. EP 11 16 8677.0, dated Nov. 29, 2012, (13 pages).
Extended European Search Report for Application No. EP 11 19 1641.7 dated Jul. 11, 2012 (14 pages).
Fossum, Eric R.. "Active Pixel Sensors: Are CCD's Dinosaurs?" SPIE: Symposium on Electronic Imaging. Feb. 1, 1993 (13 pages).
Goh et al., "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.
International Preliminary Report on Patentability for Application No. PCT/CA2005/001007 dated Oct. 16, 2006, 4 pages.
International Search Report for Application No. PCT/CA2004/001741 dated Feb. 21, 2005.
International Search Report for Application No. PCT/CA2004/001742, Canadian Patent Office, dated Feb. 21, 2005 (2 pages).
International Search Report for Application No. PCT/CA2005/001007 dated Oct. 18, 2005.
International Search Report for Application No. PCT/CA2005/001897, dated Mar. 21, 2006 (2 pages).
International Search Report for Application No. PCT/CA2007/000652 dated Jul. 25, 2007.
International Search Report for Application No. PCT/CA2009/000501, dated Jul. 30, 2009 (4 pages).
International Search Report for Application No. PCT/CA2009/001769, dated Apr. 8, 2010 (3 pages).
International Search Report for Application No. PCT/IB2010/055481, dated Apr. 7, 2011, 3 pages.
International Search Report for Application No. PCT/IB2010/055486, dated Apr. 19, 2011, 5 pages.
International Search Report for Application No. PCT/IB2010/055541 filed Dec. 1, 2010, dated May 26, 2011; 5 pages.
International Search Report for Application No. PCT/IB2011/050502, dated Jun. 27, 2011 (6 pages).
International Search Report for Application No. PCT/IB2011/051103, dated Jul. 8, 2011, 3 pages.

(56) References Cited

OTHER PUBLICATIONS

International Search Report for Application No. PCT/IB2011/055135, Canadian Patent Office, dated Apr. 16, 2012 (5 pages).
International Search Report for Application No. PCT/IB2012/052372, dated Sep. 12, 2012 (3 pages).
International Search Report for Application No. PCT/IB2013/054251, Canadian Intellectual Property Office, dated Sep. 11, 2013; (4 pages).
International Search Report for Application No. PCT/JP02/09668, dated Dec. 3, 2002, (4 pages).
International Written Opinion for Application No. PCT/CA2004/001742, Canadian Patent Office, dated Feb. 21, 2005 (5 pages).
International Written Opinion for Application No. PCT/CA2005/001897, dated Mar. 21, 2006 (4 pages).
International Written Opinion for Application No. PCT/CA2009/000501 dated Jul. 30, 2009 (6 pages).
International Written Opinion for Application No. PCT/IB2010/055481, dated Apr. 7, 2011, 6 pages.
International Written Opinion for Application No. PCT/IB2010/055486, dated Apr. 19, 2011, 8 pages.
International Written Opinion for Application No. PCT/IB2010/055541, dated May 26, 2011; 6 pages.
International Written Opinion for Application No. PCT/IB2011/050502, dated Jun. 27, 2011 (7 pages).
International Written Opinion for Application No. PCT/IB2011/051103, dated Jul. 8, 2011, 6 pages.
International Written Opinion for Application No. PCT/IB2011/055135, Canadian Patent Office, dated Apr. 16, 2012 (5 pages).
International Written Opinion for Application No. PCT/IB2012/052372, dated Sep. 12, 2012 (6 pages).
International Written Opinion for Application No. PCT/IB2013/054251, Canadian Intellectual Property Office, dated Sep. 11, 2013; (5 pages).
Jafarabadiashtiani et al.: "A New Driving Method for a-Si AMOLED Displays Based on Voltage Feedback"; dated 2005 (4 pages).
Kanicki, J., et al. "Amorphous Silicon Thin-Film Transistors Based Active-Matrix Organic Light-Emitting Displays." Asia Display: International Display Workshops, Sep. 2001 (pp. 315-318).
Karim, K. S., et al. "Amorphous Silicon Active Pixel Sensor Readout Circuit for Digital Imaging." IEEE: Transactions on Electron Devices. vol. 50, No. 1, Jan. 2003 (pp. 200-208).
Lee et al.: "Ambipolar Thin-Film Transistors Fabricated by PECVD Nanocrystalline Silicon"; dated 2006.
Lee, Wonbok: "Thermal Management in Microprocessor Chips and Dynamic Backlight Control in Liquid Crystal Displays", Ph.D. Dissertation, University of Southern California (124 pages).
Ma E Y et al.: "organic light emitting diode/thin film transistor integration for foldable displays" dated Sep. 15, 1997(4 pages).
Matsueda yet al.: "35.1: 2.5-in. AMOLED with Integrated 6-bit Gamma Compensated Digital Data Driver"; dated May 2004.
Mendes E., et al. "A High Resolution Switch-Current Memory Base Cell." IEEE: Circuits and Systems. vol. 2, Aug. 1999 (pp. 718-721).
Nathan A. et al., "Thin Film imaging technology on glass and plastic" ICM 2000, proceedings of the 12 international conference on microelectronics, dated Oct. 31, 2001 (4 pages).
Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Nathan et al.: "Backplane Requirements for active Matrix Organic Light Emitting Diode Displays,"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a-Si for AMOLED—Meeting the Performance and Cost Demands of Display Applications (Cell Phone to HDTV)"; dated 2006 (4 pages).
Office Action in Japanese patent application No. JP2006-527247 dated Mar. 15, 2010. (8 pages).
Office Action in Japanese patent application No. JP2007-545796 dated Sep. 5, 2011. (8 pages).
Partial European Search Report for Application No. EP 11 168 677.0, dated Sep. 22, 2011 (5 pages).
Partial European Search Report for Application No. EP 11 19 1641.7, dated Mar. 20, 2012 (8 pages).
Philipp: "Charge transfer sensing" Sensor Review, vol. 19, No. 2, 31 Dec. 1999 (Dec. 31, 1999), 10 pages.
Rafati et al.: "Comparison of a 17 b multiplier in Dual-rail domino and in Dual-rail D L (D L) logic styles"; dated 2002 (4 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Safavian et al.: "Three-TFT image sensor for real-time digital X-ray imaging"; dated Feb. 2, 2006 (2 pages).
Search Report for Taiwan Invention Patent Application No. 093128894 dated May 1, 2012. (1 page).
Search Report for Taiwan Invention Patent Application No. 94144535 dated Nov. 1, 2012. (1 page).
Singh, et al., "Current Conveyor: Novel Universal Active Block", Samriddhi, S-JPSET vol. I, Issue 1, 2010, pp. 41-48.
Smith, Lindsay I., "A tutorial on Principal Components Analysis," dated Feb. 26, 2001 (27 pages).
Spindler et al., System Considerations for RGBW OLED Displays, Journal of the SID 14/1, 2006, pp. 37-48.
Stewart M. et al., "polysilicon TFT technology for active matrix oled displays" IEEE transactions on electron devices, vol. 48, No. 5, dated May 2001 (7 pages).
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
Yu, Jennifer: "Improve OLED Technology for Display", Ph.D. Dissertation, Massachusetts Institute of Technology, Sep. 2008 (151 pages).
International Search Report for Application No. PCT/IB2014/058244, Canadian Intellectual Property Office, dated Apr. 11, 2014; (6 pages).
International Search Report for Application No. PCT/IB2014/059753, Canadian Intellectual Property Office, dated Jun. 23, 2014; (6 pages).
Written Opinion for Application No. PCT/IB2014/059753, Canadian Intellectual Property Office, dated Jun. 12, 2014 (6 pages).
Second Office Action in Chinese Patent Application No. 201480022682.4, dated Jan. 3, 2018, in Chinese (7 pages).

\* cited by examiner

INSPECTION SYSTEM FOR OLED DISPLAY PANELS

CROSS REFERENCE TO RELATED APPLICATIONS

This application claims the benefit of U.S. Provisional Application No. 61/861,614, filed Aug. 2, 2013, and U.S. Provisional Application No. 61/814,580, filed Apr. 22, 2013, both of which are hereby incorporated by reference herein in their entireties.

FIELD OF THE INVENTION

The present invention relates generally to OLED displays and, more particularly, to inspection systems for detecting defects and non-uniformities in displays such as active matrix organic light emitting diode displays.

BACKGROUND

Display panels can be created from an array of light emitting devices each controlled by individual circuits (i.e., pixel circuits) having transistors for selectively controlling the circuits to be programmed with display information and to cause the light emitting devices to emit light according to the display information. Thin film transistors ("TFTs") fabricated on a substrate can be incorporated into such display panels. Both OLEDs and TFTs can demonstrate non-uniform behavior across display panels due to production problems. Such problems can be corrected if the defects and non-uniformities can be identified at the time the panels are produced, e.g., during or immediately following fabrication.

SUMMARY

A system is provided for inspecting at least a portion of a display panel having thin film transistors (TFTs) and light emitting devices (OLEDs), during or immediately following fabrication, so that adjustments can be made to the fabrication procedures to avoid defects and non-uniformities. The system provides bonding pads connected to signal lines on at least portions of the display panel, and probe pads along selected edges of the display panel. The probe pads are coupled to the bonding pads through a plurality of multiplexers so that the number of probe pads is smaller than the number of bonding pads.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
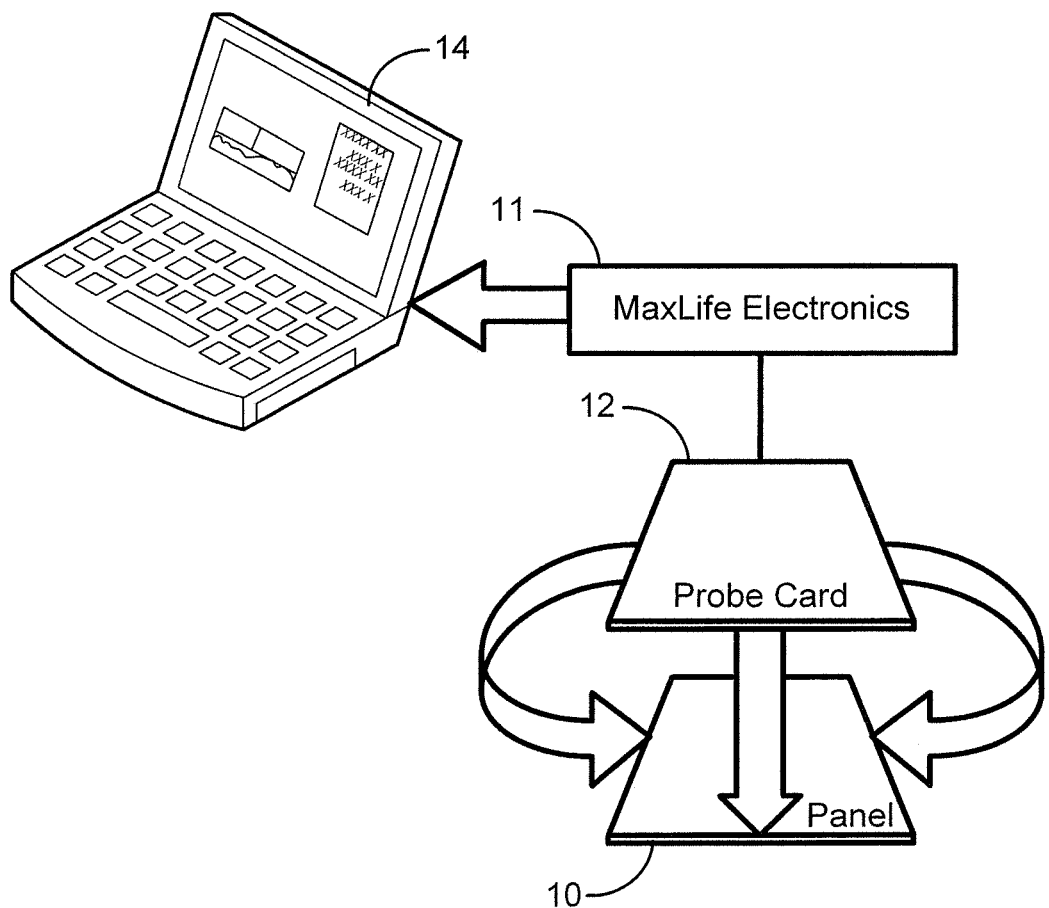
FIG. 1 is a diagrammatic perspective illustration of a display panel adapted to receive a probe card.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 illustrates a system for inspecting an OLED display panel 10 at one or more stages of the fabrication of the panel 10 (e.g., a TFT backplane, a fully fabricated panel, or a fully completed and sealed panel). The display panel 10 is coupled to a computer 14 through measurement electronics 11 and a probe card 12, to provide the capability of testing and verifying the panel at each processing step. For example, after finishing the TFT backplane, the probe card system can be used to measure the performance of the TFT backplane by itself. If the TFT backplane is acceptable, then the panel 10 is passed to the next step which can be the OLED deposition stage. After the OLED deposition is completed, the panel 10 can be measured for proper OLED deposition before sealing. After sealing, the panel 10 can be measured again before it is sent to an assembly process.

Figure 2:
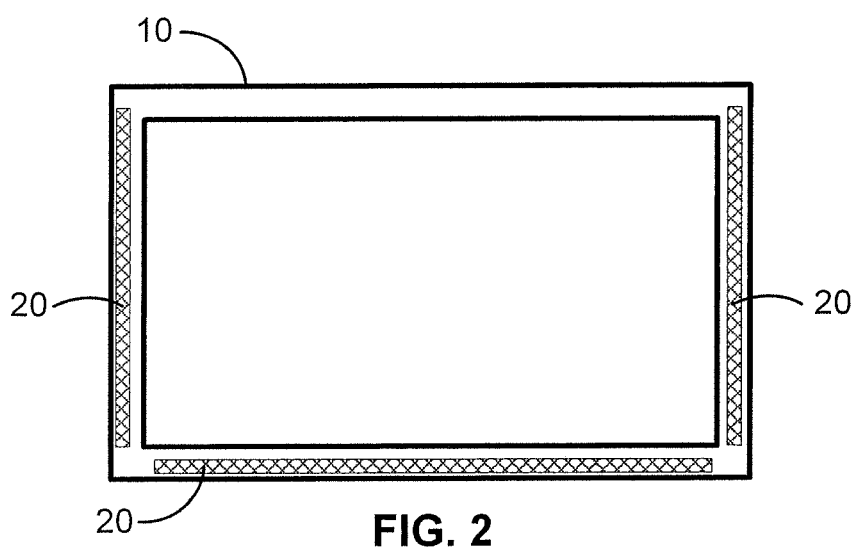
FIG. 2 is a diagrammatic front elevation of the display panel shown in FIG. 1, showing the locations of probe pads for receiving probe cards.

As can be seen in FIG. 2, the illustrative display panel 10 has probe pads 20 formed along three of the four edges of the panel. Probe pads can also be formed inside the panel, preferably before the OLED deposition stage. The probe pads 20 are used to supply test signals to the numerous pixel circuits on the display panel 10, via bonding pads 30 formed at the outer ends of the various signal lines leading to the pixel circuits.

Figure 3:
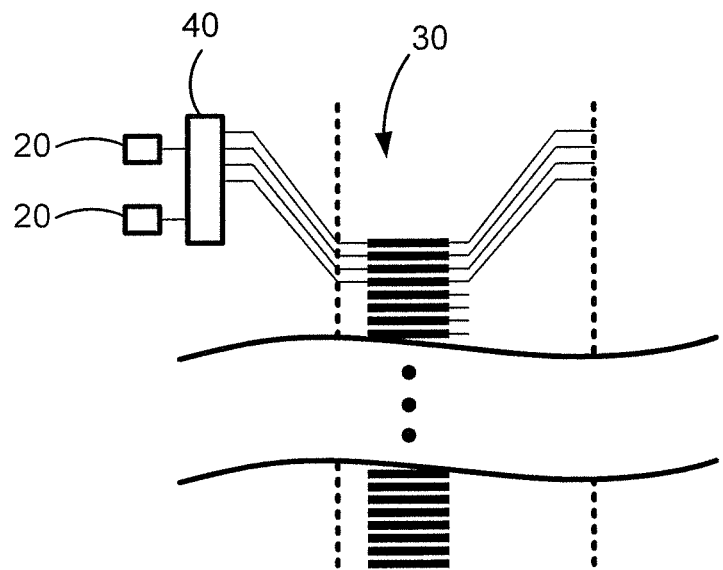
FIG. 3 is a diagram of a pair of probe pads connected to a multiplexer used to supply probe signals to the probe pads.

FIG. 3 illustrates the connection of the probe pads 20 to the bonding pads 30 through a multiplexer (MUX) 40, to reduce the required number of probe pads, which in turn permits the pad pitch to be increased. To ensure that the other signals connected to the probe pads 20 are biased properly, the MUX 40 needs to be capable of connecting each probe pad 20 to a common signal (Vcom) for each group of signals (e.g., source signals, gate signals, etc.).

Figure 4:
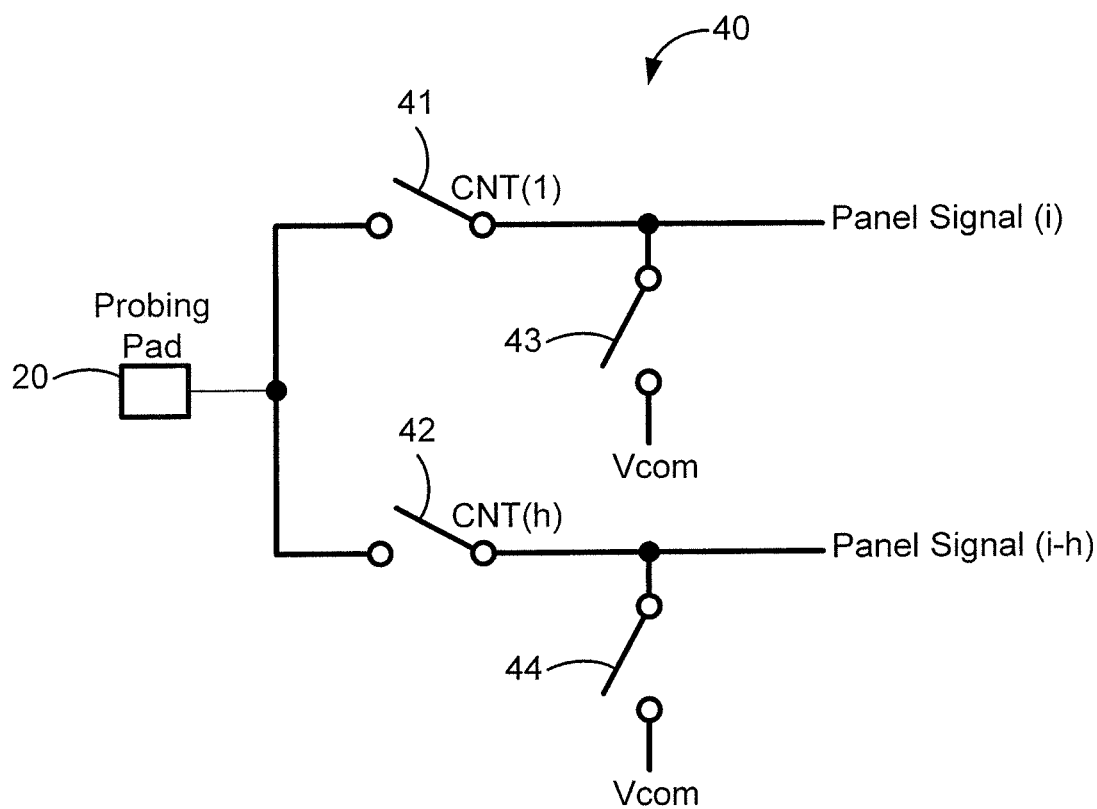
FIG. 4 is a schematic circuit diagram of one of the probe pads illustrated in FIG. 3 connected to receive the display signals.

FIG. 4 illustrates a MUX 40 with common signal control and two or more panels signals for each probe pad 20. FIG. 4 illustrates h panel signals connected to one probe pad 20, thus requiring 2 h controlling signals for connection to the probe pads 20 or connection to the common signals. The connections of the panel signals to the probe pad 20 are controlled by first switches 41 and 42, and the connections of the common signals Vcom to the panel signal lines are controlled by second switches 43 and 44.

The proper pad pitch for full panel probing is typically about 150 µm. As illustrated by the data in Table 1, the pad pitch for most conventional configurations meets the minimum pad pitch requirements. However, using multiplexing ratios of 2:1 or greater permits the pad pitch to be increased, resulting in much simpler probe cards, as also illustrated by the data in Table 1:

TABLE 1

Pad pitch for different display sizes and resolutions.

| Panel | MUX | Gate Pad Pitch (μm) | Source Pad Pitch (μm) | EIC Pad Pitch (μm) |
|---|---|---|---|---|
| 55" HD | 1:1 | 295 | 330 | 330 |
| 55" HD | 2:1 | 592 | 661 | 661 |
| 55" HD | 8:1 | 2370 | 2645 | 2645 |
| 55" UD | 1:1 | 148 | 165 | 165 |
| 55" UD | 2:1 | 295 | 330 | 330 |
| 55" UD | 8:1 | 1185 | 1132 | 1132 |
| 78" UD | 1:1 | 222 | 222 | 222 |
| 78" UD | 2:1 | 444 | 445 | 445 |
| 78" UD | 8:1 | 1777 | 1781 | 1781 |

Figure 5:
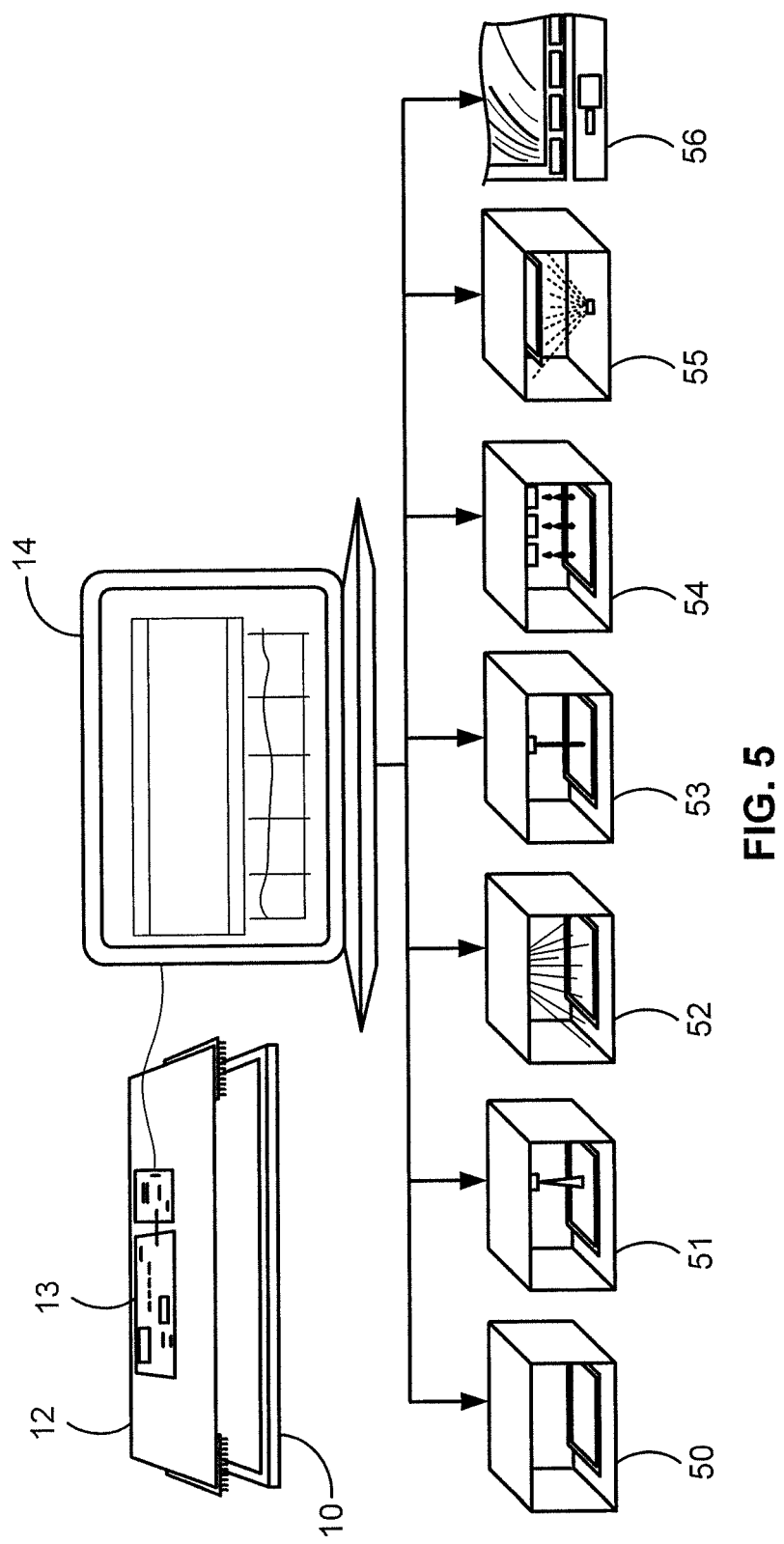
FIG. 5 is a diagrammatic illustration of an inspection system for taking measurements of an AMOLED panel, and various corrective actions that can be taken to fix defects identified by analysis of the measurements.

As depicted in FIG. 5, an electronic measuring system 13 mounted on the probe card 12 can measure the electrical characteristics of every TFT and every OLED device in a display panel 10 and identify defects and non-uniformities. This data is supplied to a GUI 14, where the data can be used to fine-tune every process step, to achieve higher yields, faster process ramp-up, and lower line monitoring costs. Examples of the various process steps that can be fine tuned are illustrated in FIG. 5, namely, a sputtering and PECVD module 50, a process annealing module 51, a patterning module 52, a laser repair module 53, an inkjet printing module 54 and an evaporation module 55. The end result is a complete display panel 56.

The circuitry depicted in FIG. 5 takes data from the measurement electronics 13, analyzes that data, and displays it in a wide variety of reports, tables, and pictures. Some of the views are described in the following table:

| View | Description |
|---|---|
| TFT Absolute LUT | View the absolute measurement replacement values for each pixel on the panel. |
| TFT Filtered LUT | View the filtered replacement values used to calculate delta values. |
| TFT Base LUT | View the factory shipment values of the panel to determine how much the pixels have aged (baseline). |
| TFT Delta LUT | View the difference between the current average measured value and the baseline values (used to determine compensation). |
| TFT Histogram LUT | View the number of times a pixel has been measured since the last time the histogram was reset. This lookup table is primarily used for priority scan algorithm. |
| TFT Pixel State LUT | View either the current state of the measurement state machine or the last comparison values for each pixel. |
| TFT Region Priority | Show the priority of each region in the priority scan algorithm. |
| OLED Absolute LUT | View the absolute measurement replacement values for each pixel on the panel OLED layer. |
| OLED Filtered LUT | View the filtered replacement values used to calculate delta values. |
| OLED Base LUT | View the factory shipment values of the panel to determine how much the pixels have aged (baseline). |
| OLED Histogram | View the number of times a pixel has been measured since the last time the histogram was reset. |
| OLED Pixel State | View either the current state of the measurement state machine or the last comparison values for each pixel. |
| OLED Region Priority | Show the priority of each region in the priority scan algorithm. |

-continued

| View | Description |
|---|---|
| Dead Pixels LUT | Show which pixels were either dead at point of manufacture or have since been determined to be unresponsive. Note that dead pixels are not compensated. |
| Combine Delta LUT | The combined TFT and OLED delta values used to determine the final compensation. |
| Scratch LUT | A temporary LUT View to allow users to manipulate the data without making modifications to the system tables or to simply "backup" a table. |
| Statistics | Reports the performance statistics and the current frame rate. Use these statistics to compare the time required to process and display the current data in MaxLife Viewer vs. the time it would actually take if the display was not required. |
| Pixel Trends | View the pixel state to determine if there are unsettled pixels and view comparative levels. Allows you to obtain a visual representation of uncertainty zones and look at specific defective pixels. Use this option to obtain active measurements over time; determine how many times a pixel was measured before it settled. |
| Uniformity Report Offset | Select a LUT table, then analyze the uniformity. |
| Characterization | Plots the V-to-I voltage DAC code to the probability of a comparator result flip. |
| Hardware Configuration | View the current hardware configuration parameters. |
| Display Controls | Adds the Display Controls to the bottom of the current tab. These options allow you to set the frame refresh rate in frames per second. Drag the slider to the left or right to speed up or slow down the refresh rate. Slower speeds are more visible to the naked eye. |
| CLI View | Issues commands from MaxLife Viewer to the system. |

A wide variety of different circuitry and algorithms may be used for extracting measurements of different parameters from the display panel at different stages of its fabrication, such as the extraction systems described in U.S. patent application Ser. No. 13/835,124 filed Mar. 15, 2013 and entitled "Systems and Methods for Extrraction of Threshold and Mobility Parameters in AMOLED Displays," which is incorporated by reference herein in its entirety.

The inspection system can identify many potential defects and problems (e.g., with sputtering and PECVD steps, that can be used to identify the likely cause of the defect or problem so that the fabricating process can be immediately fine-tuned to correct the problem). Examples of such issues and their likely causes are the following:

| Issue identified by MaxLife ™ inspection system | Likely cause |
|---|---|
| Line defect (open circuit on metal lines) | Particle defect during deposition, poor adhesion, contaminated substrate and poor step coverage. |
| High resistance or non-uniform resistance on metal lines | Non-uniform sputtering process, contaminated sputter gas or process chamber. |
| Non-uniform TFT contact resistance | Problem with n+ layer PECVD step, incomplete via etch or photoresist stripping process. |
| Vt or mobility of TFTs out of specification | Problem with a-Si layer PECVD step (contamination during deposition, process parameter drift or film stress) |
| Open TFT channel | Problem with a-Si or n+ layer deposition (particle contamination during deposition/contaminated substrate) |

-continued

| Issue identified by MaxLife ™ inspection system | Likely cause |
| --- | --- |
| Gate shorted to fixed voltage | Incomplete metal patterning and/or damaged dielectric layers from particles or ESD |
| Source or gate shorted to drain | Damaged dielectric layers (pinholes) from particles or ESD |
| Open or high resistance contacts | Incomplete via etching. |
| Out of spec capacitance | Non-uniform dielectric layer deposition or drift in deposition process parameters. |
| Line defect (crossover short) | Pinhole in the dielectric layers from particles or ESD |

Figure 6:
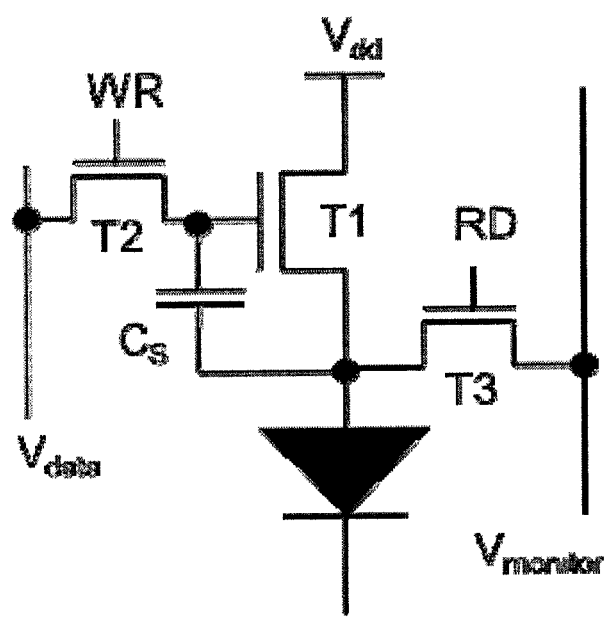
FIG. 6 is a schematic circuit diagram of a pixel circuit having a signal WR.

For defects that cannot be directly identified by a single measurement of the inspection system, the first measurement can reveal that a problem exists, and specify additional tests that will conclusively identify the exact defect. One example is the identification of line defects, which can be detected by any of the following procedures:
1. Measuring the current of different lines: if the current is higher than a threshold, the pixel is shorted.
2. Applying pulse to measure the charge transfer: if the amount of charge transfer is smaller than a threshold, the line is open.
3. For a signal with connection to DC current (e.g., Vdd and Vmonitor), the current can be measured to detect the open defect Defects in the thin film transistors (TFTs) can also be detected. For example, in the situation where the pixel circuit in FIG. 6 has a signal WR measured as high (while Vdata=high, and also while Vdata=low, and Vdd=high), an additional test needs to be performed. Table 1 shows the different conditions and what the results mean.

To detect problems with process annealing, the exact Vt and mobility of each TFT can be used to adjust process annealing parameters, as follows:

| Issue identified by MaxLife ™ inspection system | Likely cause |
| --- | --- |
| Vt and/or mobility of TFTs is higher or lower than specification | Laser power drift |
| Small scale non-uniformity of Vt and/or mobility of TFTs | Intermittent laser power output |
| Large scale non-uniformity of Vt and/or mobility of TFTs | Laser repeatability |

The number and types of defects can be used to identify problems in patterning (particles, under/over exposure, etc.), as follows:

| Issue identified by MaxLife ™ inspection system | Likely cause |
| --- | --- |
| High-resistance metal lines | Pattern definition or metal etch process. Poor line width control. |
| Open or high resistance contacts | Poor via pattern definition/photoresist residue |
| Gate shorted to fixed voltage | Pinholes in the dielectric layers. |
| Abnormal capacitance or resistance in corners of panel | Mask alignment error (rotation), photoresist thickness non-uniformity. |
| Large scale capacitance or resistance, non-uniformity | Pattern alignment error or exposure power fluctuation. |
| Adjacent metal lines shorted | Particles in photoresist/pattern definition. |
| Pattern stitching defects | Stepper alignment failure |
| Repetitive defect | Exposure masks damage or contaminated. |

The defect location and defect type can be used to pinpoint areas suitable for laser repair (removing material) or ion beam deposition (adding material), as follows:

| Issue identified by MaxLife ™ inspection system | Repair Step |
| --- | --- |
| Gate shorted to fixed voltage | Give exact pixel location to laser repair system |
| Short on metal lines | Identify the metal lines that are shorted. |
| Open circuit on metal lines | Identify the metal lines that are open. |
| Open or high resistance TFT contacts | Quickly identify the number and location of the defective pixels. |

The uniformity data can also be used to continuously calibrate each print head used for inkjet printing, in real-time. The system knows which print head was used to print each pixel, and thus problems with individual print heads can be detected. The print head used to print those pixels can then be immediately adjusted, as follows.

| Issue identified by MaxLife ™ inspection system | Likely cause |
| --- | --- |
| Dead pixels | Printhead occasionally putting down too little material, causing shorts |
| Stuck-on pixel | Printhead occasionally putting down too little material |
| High-resistance pixels | The printhead printing those pixels may be putting down too much material |
| Uniformity of OLED's voltage is poor | Flow control of printhead malfunctioning |

The exact failure mode of every OLED device can be used to tune the evaporation process, as follows:

| Issue identified by MaxLife ™ inspection system | Likely cause |
| --- | --- |
| All pixels from one printhead are too high (or too low) resistance | Problem with calibration of printhead |
| Short-circuit OLED | Too little organic material being deposited, causing shorts |
| High-resistance pixels | Too much organic material being deposited |
| OLED voltage too high | Too much organic material being deposited |
| Long-range Uniformity of OLED's voltage is poor | Problem with substrate rotation or evaporator too close to substrate |
| Short-range uniformity of OLED's voltage is poor | Problem with thermal evaporation temperature control |
| Open-circuit OLED | Particles during evaporation |
| Short to cathode or anode | Particles during evaporation |
| Partial short (low resistance) | Too little organic material being deposited |

The electrical characteristics (collected during TFT and OLED inspection) can be loaded into a lookup table, and used to correct for all TFT and OLED non-uniformities.

Additional defects can be identified once both the OLEDs and TFTs have been deposited. The first measurement can identify that a problem exists, and specify additional tests that will conclusively identify the exact defect.

If test samples are created around the periphery of the panel, then more details about the global process parameters can be extracted. Typically this is done by cutting off the test samples from a small percentage of displays and putting them in a separate characterization system. However, with the present inspection system, this can be done as part of panel characterization, for every panel, as follows:

Metal lines can be created and resistance measured. This can test both metal deposition steps and etching.

Semiconductor layers to be annealed can have their characteristics and uniformity tested.

Structures can be used at different locations around the panel to test alignment.

OLED structures can be used to test evaporation and inkjet printing steps.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

The invention claimed is:

1. A method of fabricating a display panel, said method comprising:

fabricating a thin film transistor (TFT) backplane for the display panel, including:

forming a plurality of pixel circuits that include TFTs; and prior to including any organic light emitting diodes (OLEDs) on the TFT backplane:

forming bonding pads connected to respective signal lines on at least portions of the TFT backplane;

forming probe pads along selected edges of said portions of the TFT backplane;

forming common signal lines in said backplane; and forming a plurality of multiplexers within said TFT backplane for coupling said probe pads to said bonding pads and for coupling said common signal lines to said probe pads, the number of probe pads less than the number of bonding pads, in which said plurality of multiplexers are configured to controllably separately connect each of said probe pads to each of at least two of said bonding pads, each multiplexer including first switches providing connections of multiple panel signal lines via respective bonding pads to a probe pad, and second switches providing connections of said common signal lines to panel signal lines via respective bonding pads;

engaging said probe pads of said TFT backplane with measurement electronics prior to including any OLEDs on the TFT backplane;

supplying test signals from said measurement electronics via said probe pads and said plurality of multiplexers to test said TFTs of the TFT backplane prior to including any OLEDs on the TFT backplane steering common signals, received by said multiplexers over said common signal lines, to said panel signal lines via respective bonding pads; and forming OLEDs on the TFT backplane within said pixel circuits, subsequent to supplying said test signals.

2. The method of claim 1 in which a computer is coupled to said measurement electronics.

3. The method of claim 1 in which said probe pads are formed along a plurality of edges of said TFT backplane.

4. The method of claim 1 in which said display panel is an AMOLED display panel.

5. The method of claim 1 in which each of said multiplexers is capable of connecting each probe pad to common signals (Vcom) for multiple groups of signals.

6. The method of claim 1 in which said testing of said TFTs includes measuring the electrical characteristics of the TFTs of the pixel circuits of the TFT backplane.

7. A thin film transistor (TFT) backplane for a display panel, the TFT backplane comprising:

a plurality of pixel circuits that include thin film transistors (TFTs) and do not include any organic light emitting devices (OLEDs), multiple signal lines on portions of the TFT backplane, multiple respective bonding pads connected to said signal lines, common signal lines;

multiple probe pads positioned along selected edges of the portions of the display panel that have said signal lines, for engagement with measurement electronics for providing test signals to test said TFTs of the TFT backplane prior to OLED deposition, and multiple multiplexers for coupling said probe pads to said bonding pads and for coupling said common signal lines to said bonding pads, each multiplexer including first switches providing connections of multiple panel signal lines via respective bonding pads to a probe pad, and second switches providing connections of said common signal lines to panel signal lines via respective bonding pads, and each multiplexer configured to controllably separately connect each of said probe pads to each of at least two of said bonding pads during said testing of said TFTs of the TFT backplane prior to OLED deposition and configured to controllably steer common signals, received by said multiplexers over said common signal lines, to said panel signal lines via respective bonding pads.

8. The TFT backplane of claim 7 which includes a computer coupled to said measurement electronics.

9. The TFT backplane of claim 7 in which said probe pads are formed along a plurality of edges of said TFT backplane.

10. The TFT backplane of claim 7 in which said display panel is an AMOLED display panel.

11. The TFT backplane of claim 7 in which each of said multiplexers is capable of connecting each probe pad to common signals (Vcom) for multiple groups of signals.

12. The TFT backplane of claim 7 which includes a processor configured to measure the electrical characteristics of the TFTs of the pixel circuits of the TFT backplane, and to identify defects and non-uniformities in the TFT backplane based on the measured electrical characteristics.

\* \* \* \* \*